US009406871B2

(12) United States Patent
Nakayama et al.

(10) Patent No.: US 9,406,871 B2
(45) Date of Patent: Aug. 2, 2016

(54) MAGNETORESISTIVE ELEMENT AND METHOD OF MANUFACTURING THE SAME

(71) Applicants: Masahiko Nakayama, Seoul (KR); Masatoshi Yoshikawa, Seoul (KR); Tadashi Kai, Seoul (KR); Yutaka Hashimoto, Seoul (KR); Masaru Toko, Seoul (KR); Hiroaki Yoda, Seoul (KR); Jae Geun Oh, Icheon-si (KR); Keum Bum Lee, Icheon-si (KR); Choon Kun Ryu, Seoul (KR); Hyung Suk Lee, Icheon-si (KR); Sook Joo Kim, Icheon-si (KR)

(72) Inventors: Masahiko Nakayama, Seoul (KR); Masatoshi Yoshikawa, Seoul (KR); Tadashi Kai, Seoul (KR); Yutaka Hashimoto, Seoul (KR); Masaru Toko, Seoul (KR); Hiroaki Yoda, Seoul (KR); Jae Geun Oh, Icheon-si (KR); Keum Bum Lee, Icheon-si (KR); Choon Kun Ryu, Seoul (KR); Hyung Suk Lee, Icheon-si (KR); Sook Joo Kim, Icheon-si (KR)

(73) Assignees: KABUSHIKI KAISHA TOSHIBA, Tokyo (JP); SK HYNIX INC., Ichenon-Si, Gyeonggi-Do (KR)

( * ) Notice: Subject to any disclaimer, the term of this patent is extended or adjusted under 35 U.S.C. 154(b) by 0 days.

(21) Appl. No.: 14/807,267

(22) Filed: Jul. 23, 2015

(65) Prior Publication Data
US 2015/0325785 A1 Nov. 12, 2015

Related U.S. Application Data

(62) Division of application No. 14/202,802, filed on Mar. 10, 2014, now Pat. No. 9,123,879.

(60) Provisional application No. 61/875,577, filed on Sep. 9, 2013.

(51) Int. Cl.
| | | |
|---|---|---|
| H01L 43/00 | (2006.01) |
| H01L 43/02 | (2006.01) |
| H01L 27/22 | (2006.01) |
| H01L 43/08 | (2006.01) |
| H01L 43/12 | (2006.01) |
| H01L 43/10 | (2006.01) |

(52) U.S. Cl.
CPC .............. *H01L 43/02* (2013.01); *H01L 27/222* (2013.01); *H01L 27/224* (2013.01); *H01L 43/08* (2013.01); *H01L 43/10* (2013.01); *H01L 43/12* (2013.01); *H01L 27/226* (2013.01)

(58) Field of Classification Search
CPC ........ H01L 43/08; H01L 27/222; H01L 43/10
See application file for complete search history.

(56) References Cited

U.S. PATENT DOCUMENTS

| 6,165,803 A | 12/2000 | Chen et al. |
| 6,297,983 B1 | 10/2001 | Bhattacharyya |

(Continued)

FOREIGN PATENT DOCUMENTS

| JP | 04241481 A | 8/1992 |
| JP | 09041138 A | 2/1997 |

(Continued)

OTHER PUBLICATIONS

Related U.S. Appl. No. 13/226,868; First Named Inventor: Yuichi Ohsawa; Title: "Method of Manufacturing Magnetic Memory"; filed Sep. 7, 2011.
Related U.S. Appl. No. 13/226,960; First Named Inventor: Yuichi Ohsawa; Title: "Method of Manufacturing Multilayer Film"; filed Sep. 7, 2011.
Related U.S. Appl. No. 13/231,894; First Named Inventor: Shigeki Takahashi; Title: "Magnetic Memory and Method of Manufacturing the Same"; filed Sep. 13, 2011.
Related U.S. Appl. No. 13/604,537; First Named Inventor: Masahiko Nakayama; Title: "Magnetic Memory Element and Magnetic Memory"; filed Sep. 5, 2012.
Related U.S. Appl. No. 14/200,670; First Named Inventor: Kuniaki Sugiura; Title: "Magnetoresistive Element and Method of Manufacturing the Same"; filed Mar. 7, 2014.
Related U.S. Appl. No. 14/200,742; First Named Inventor: Masaru Toko; Title: "Magnetoresistive Element and Method for Manufacturing the Same"; filed Mar. 7, 2014.

(Continued)

*Primary Examiner* — Ngan Ngo
(74) *Attorney, Agent, or Firm* — Holtz, Holtz & Volek PC

(57) ABSTRACT

According to one embodiment, a magnetoresistive element is disclosed. The magnetoresistive element includes a reference layer, a tunnel barrier layer, a storage layer. The storage layer includes a first region and a second region provided outside the first region to surround the first region, the second region including element included in the first region and another element being different from the element. The magnetoresistive element further includes a cap layer including a third region and a fourth region provided outside the third region to surround the third region, the fourth region including an element included in the third region and the another element.

12 Claims, 11 Drawing Sheets

(56) References Cited

U.S. PATENT DOCUMENTS

| | | | |
|---|---|---|---|
| 6,365,286 B1 | 4/2002 | Inomata et al. | |
| 6,391,430 B1 | 5/2002 | Fullerton et al. | |
| 6,479,353 B2 | 11/2002 | Bhattacharyya | |
| 6,483,675 B1 | 11/2002 | Araki et al. | |
| 6,713,830 B2 | 3/2004 | Nishimura et al. | |
| 6,829,121 B2 | 12/2004 | Ikeda et al. | |
| 6,895,658 B2 | 5/2005 | Shimazawa et al. | |
| 6,965,138 B2 | 11/2005 | Nakajima et al. | |
| 6,987,652 B2 | 1/2006 | Koganei | |
| 7,220,601 B2 | 5/2007 | Hwang et al. | |
| 7,586,781 B2 | 9/2009 | Saitoh et al. | |
| 7,619,431 B2 | 11/2009 | DeWilde et al. | |
| 7,746,603 B2 | 6/2010 | Gill | |
| 7,768,824 B2 | 8/2010 | Yoshikawa et al. | |
| 7,916,430 B2 | 3/2011 | Kagami et al. | |
| 7,957,184 B2 | 6/2011 | Yoshikawa et al. | |
| 8,119,018 B2 | 2/2012 | Ikemoto et al. | |
| 8,130,474 B2 | 3/2012 | Childress et al. | |
| 8,139,405 B2 | 3/2012 | Yoshikawa et al. | |
| 8,154,915 B2 | 4/2012 | Yoshikawa et al. | |
| 8,218,355 B2 | 7/2012 | Kitagawa et al. | |
| 8,223,533 B2 | 7/2012 | Ozeki et al. | |
| 8,268,713 B2 | 9/2012 | Yamagishi et al. | |
| 8,270,125 B2 | 9/2012 | Gill | |
| 8,339,841 B2 | 12/2012 | Iwayama | |
| 8,475,672 B2 | 7/2013 | Iori et al. | |
| 8,710,605 B2 | 4/2014 | Takahashi et al. | |
| 8,716,034 B2 | 5/2014 | Ohsawa et al. | |
| 8,928,055 B2 | 1/2015 | Saida et al. | |
| 8,963,264 B2 | 2/2015 | Dimitrov et al. | |
| 2001/0022742 A1 | 9/2001 | Bhattacharyya | |
| 2001/0024347 A1 | 9/2001 | Shimazawa et al. | |
| 2002/0070361 A1 | 6/2002 | Mack et al. | |
| 2002/0146851 A1 | 10/2002 | Okazawa et al. | |
| 2002/0167059 A1 | 11/2002 | Nishimura et al. | |
| 2002/0182442 A1 | 12/2002 | Ikeda et al. | |
| 2003/0067800 A1 | 4/2003 | Koganei | |
| 2004/0080876 A1 | 4/2004 | Sugita et al. | |
| 2004/0135184 A1* | 7/2004 | Motoyoshi | H01L 27/228 257/295 |
| 2004/0188732 A1 | 9/2004 | Fukuzumi | |
| 2005/0020076 A1 | 1/2005 | Lee et al. | |
| 2005/0048675 A1 | 3/2005 | Ikeda | |
| 2005/0174876 A1 | 8/2005 | Katoh | |
| 2005/0254289 A1 | 11/2005 | Nakajima et al. | |
| 2005/0274997 A1 | 12/2005 | Gaidis et al. | |
| 2006/0043317 A1 | 3/2006 | Ono et al. | |
| 2006/0105570 A1 | 5/2006 | Hautala et al. | |
| 2007/0076328 A1* | 4/2007 | Jayasekara | G11B 5/11 360/323 |
| 2007/0164338 A1 | 7/2007 | Hwang et al. | |
| 2008/0073641 A1* | 3/2008 | Cheng | B82Y 10/00 257/25 |
| 2008/0122005 A1 | 5/2008 | Horsky et al. | |
| 2009/0080238 A1 | 3/2009 | Yoshikawa et al. | |
| 2009/0191696 A1 | 7/2009 | Shao et al. | |
| 2009/0243008 A1 | 10/2009 | Kitagawa et al. | |
| 2009/0285013 A1 | 11/2009 | Saitoh et al. | |
| 2010/0097846 A1 | 4/2010 | Sugiura et al. | |
| 2010/0135068 A1 | 6/2010 | Ikarashi et al. | |
| 2010/0183902 A1 | 7/2010 | Kim et al. | |
| 2010/0230770 A1 | 9/2010 | Yoshikawa et al. | |
| 2011/0037108 A1 | 2/2011 | Sugiura et al. | |
| 2011/0059557 A1 | 3/2011 | Yamagishi et al. | |
| 2011/0174770 A1 | 7/2011 | Hautala | |
| 2011/0211389 A1 | 9/2011 | Yoshikawa et al. | |
| 2011/0222335 A1 | 9/2011 | Yoshikawa et al. | |
| 2011/0233697 A1 | 9/2011 | Kajiyama | |
| 2012/0032288 A1 | 2/2012 | Tomioka | |
| 2012/0056253 A1 | 3/2012 | Iwayama et al. | |
| 2012/0074511 A1 | 3/2012 | Takahashi et al. | |
| 2012/0135543 A1 | 5/2012 | Shin et al. | |
| 2012/0139019 A1 | 6/2012 | Iba | |
| 2012/0244639 A1 | 9/2012 | Ohsawa et al. | |
| 2012/0244640 A1 | 9/2012 | Ohsawa et al. | |
| 2013/0001716 A1* | 1/2013 | Yamakawa | H01L 43/12 257/421 |
| 2013/0008867 A1* | 1/2013 | Tokashiki | B82Y 40/00 216/22 |
| 2013/0017626 A1 | 1/2013 | Tomioka | |
| 2013/0029431 A1* | 1/2013 | Takahashi | H01L 43/12 438/3 |
| 2013/0069182 A1* | 3/2013 | Ohsawa | H01L 29/82 257/421 |
| 2013/0069186 A1 | 3/2013 | Toko et al. | |
| 2013/0099338 A1 | 4/2013 | Nakayama et al. | |
| 2013/0181305 A1 | 7/2013 | Nakayama et al. | |
| 2014/0087483 A1* | 3/2014 | Ohsawa | H01J 37/08 438/3 |
| 2014/0319590 A1* | 10/2014 | Nakatsuka | H01L 27/228 257/295 |
| 2014/0327096 A1 | 11/2014 | Guo | |
| 2014/0356979 A1 | 12/2014 | Annunziata et al. | |
| 2015/0069542 A1 | 3/2015 | Nagamine et al. | |
| 2015/0069561 A1* | 3/2015 | Tan | H01L 43/12 257/421 |
| 2016/0087004 A1* | 3/2016 | Sonoda | H01L 27/228 257/252 |

FOREIGN PATENT DOCUMENTS

| | | |
|---|---|---|
| JP | 2000156531 A | 6/2000 |
| JP | 2001052316 A | 2/2001 |
| JP | 2001308292 A | 11/2001 |
| JP | 2002176211 A | 6/2002 |
| JP | 2002280640 A | 9/2002 |
| JP | 2002299726 A | 10/2002 |
| JP | 2002299727 A | 10/2002 |
| JP | 2002305290 A | 10/2002 |
| JP | 2003110162 A | 4/2003 |
| JP | 2003536199 A | 12/2003 |
| JP | 2004006589 A | 1/2004 |
| JP | 2004500483 A | 1/2004 |
| JP | 2005209951 A | 8/2005 |
| JP | 2006005342 A | 1/2006 |
| JP | 2006510196 A | 3/2006 |
| JP | 2006165031 A | 6/2006 |
| JP | 2007053315 A | 3/2007 |
| JP | 2007234897 A | 9/2007 |
| JP | 2007305610 A | 11/2007 |
| JP | 2008066612 A | 3/2008 |
| JP | 2008522429 A | 6/2008 |
| JP | 2008153527 A | 7/2008 |
| JP | 2008171882 A | 7/2008 |
| JP | 2008193103 A | 8/2008 |
| JP | 2008282940 A | 11/2008 |
| JP | 2009054715 A | 3/2009 |
| JP | 2009081216 A | 4/2009 |
| JP | 2009239120 A | 10/2009 |
| JP | 2010003342 A | 1/2010 |
| JP | 2010113782 A | 5/2010 |
| JP | 2011040580 A | 2/2011 |
| JP | 2011054873 A | 3/2011 |
| JP | 2012244051 A | 12/2012 |
| JP | 2013153232 A | 8/2013 |
| WO | 2005088745 A1 | 9/2005 |

OTHER PUBLICATIONS

Related U.S. Appl. No. 14/203,249; First Named Inventor: Masahiko Nakayama; Title: "Magnetic Memory and Method of Manufacturing the Same"; filed Mar. 10, 2014.

Albert, et al., "Spin-polarized current switching of a Co thin film nanomagnet", Applied Physics Letters, vol. 77, No. 23, Oct. 7, 2000, 3809-3811.

Otani, et al., "Microfabrication of Magnetic Tunnel Junctions Using CH3OH Etching", IEEE Transactions on Magnetics, vol. 43, No. 6, Jun. 6, 2007, 2776-2778.

International Search Report including Written Opinion dated Sep. 22, 2014, issued in parent International Application No. PCT/JP2014/072663.

* cited by examiner

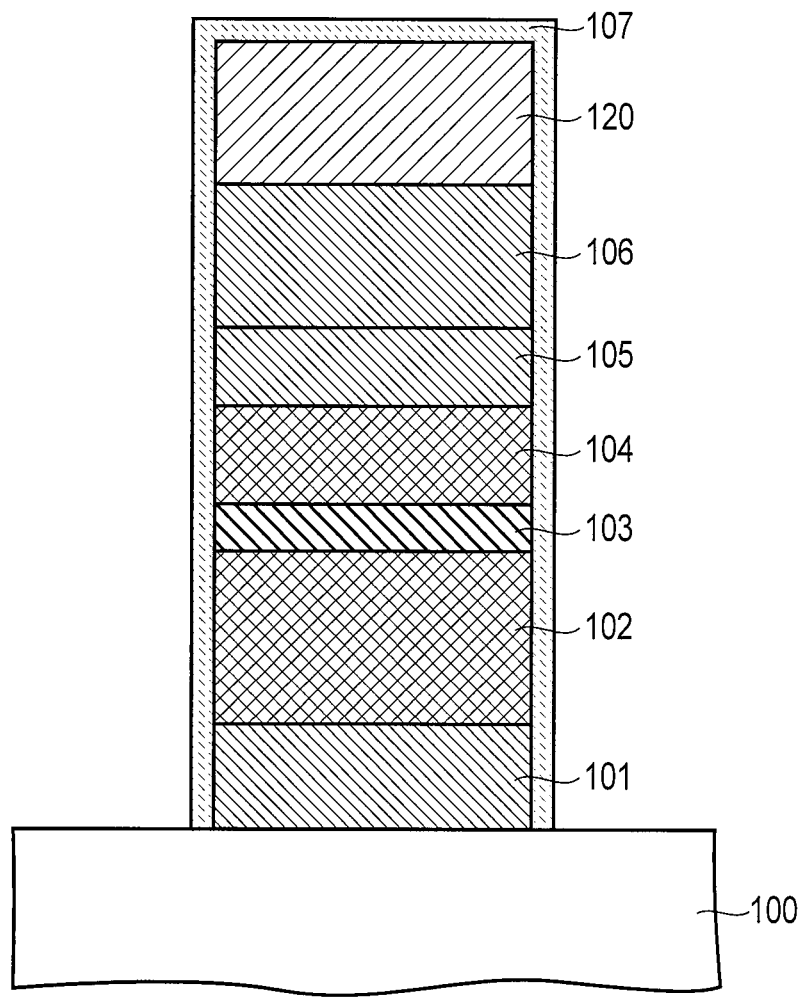
F I G. 3

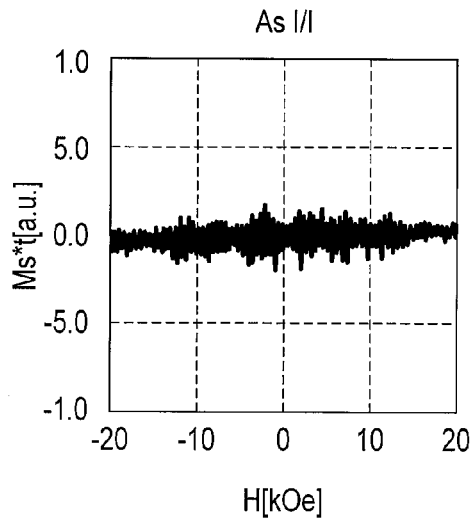
F I G. 6
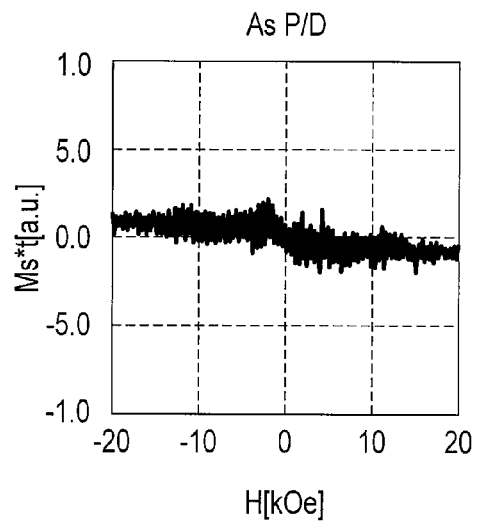
F I G. 8
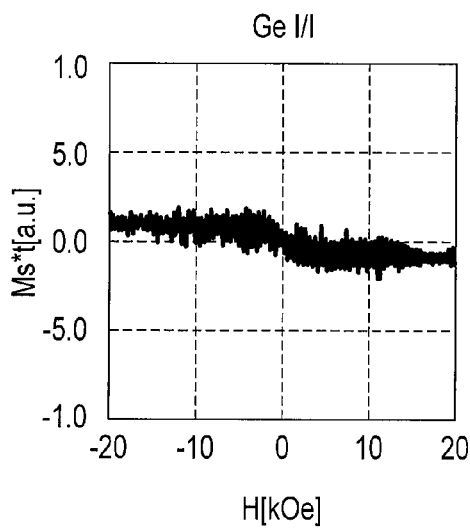
F I G. 7
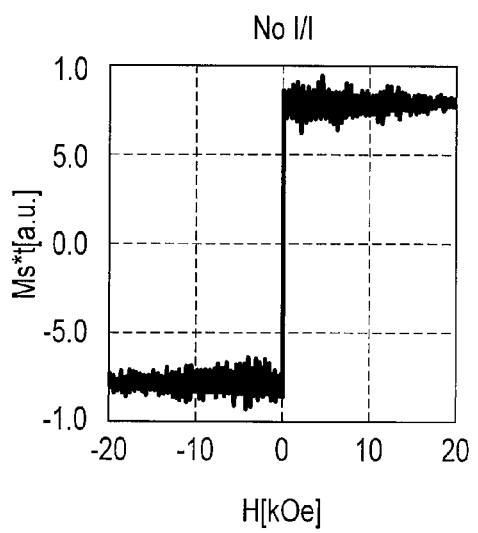
F I G. 9

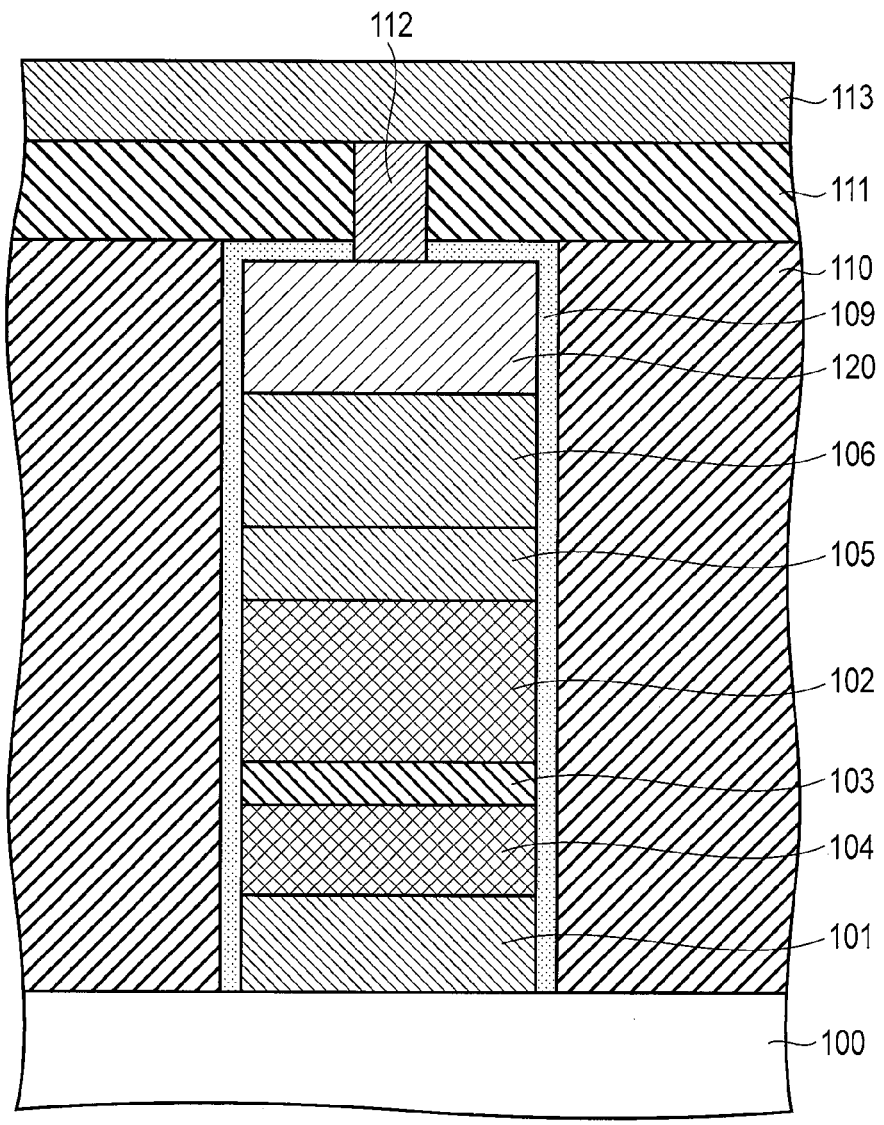
F I G. 10

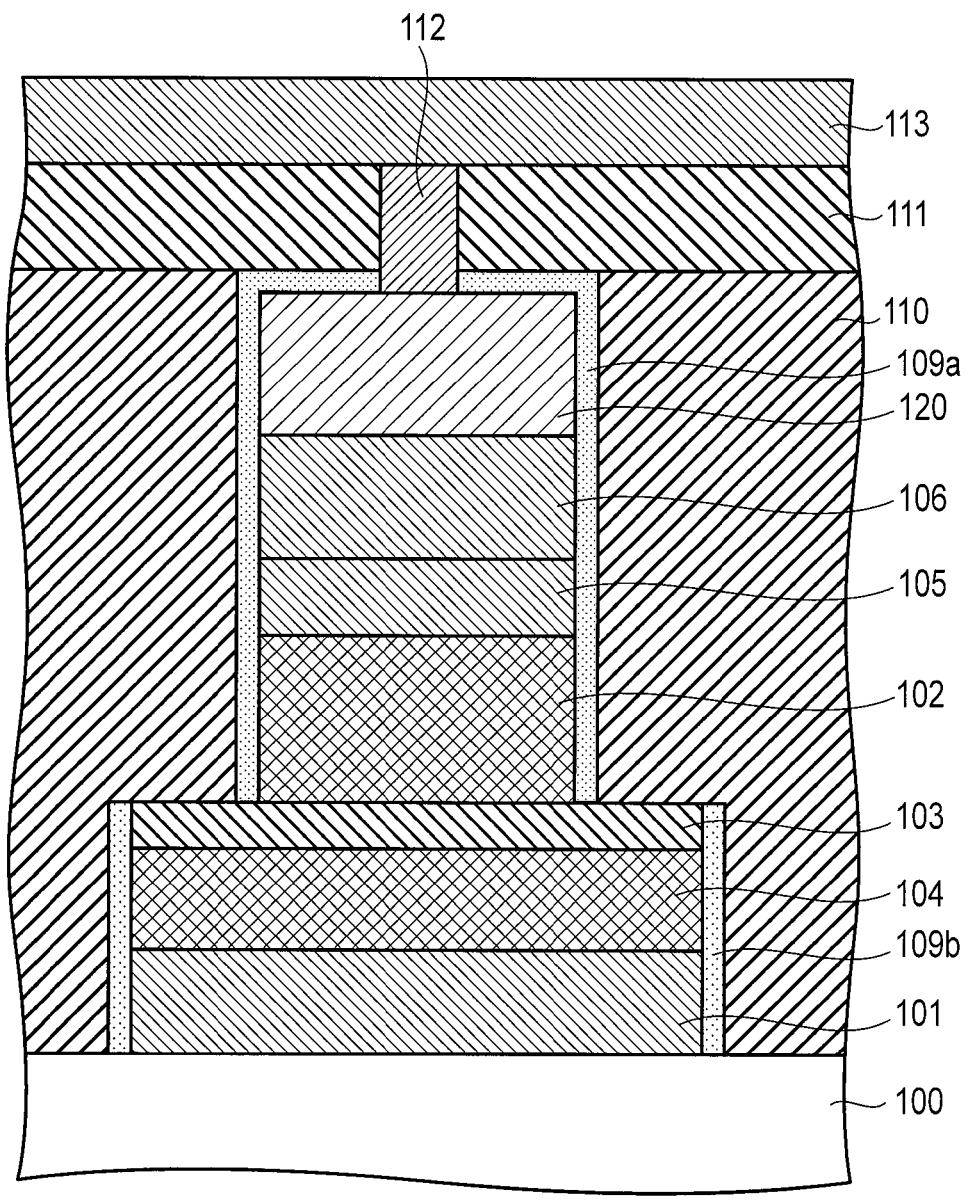
F I G. 11

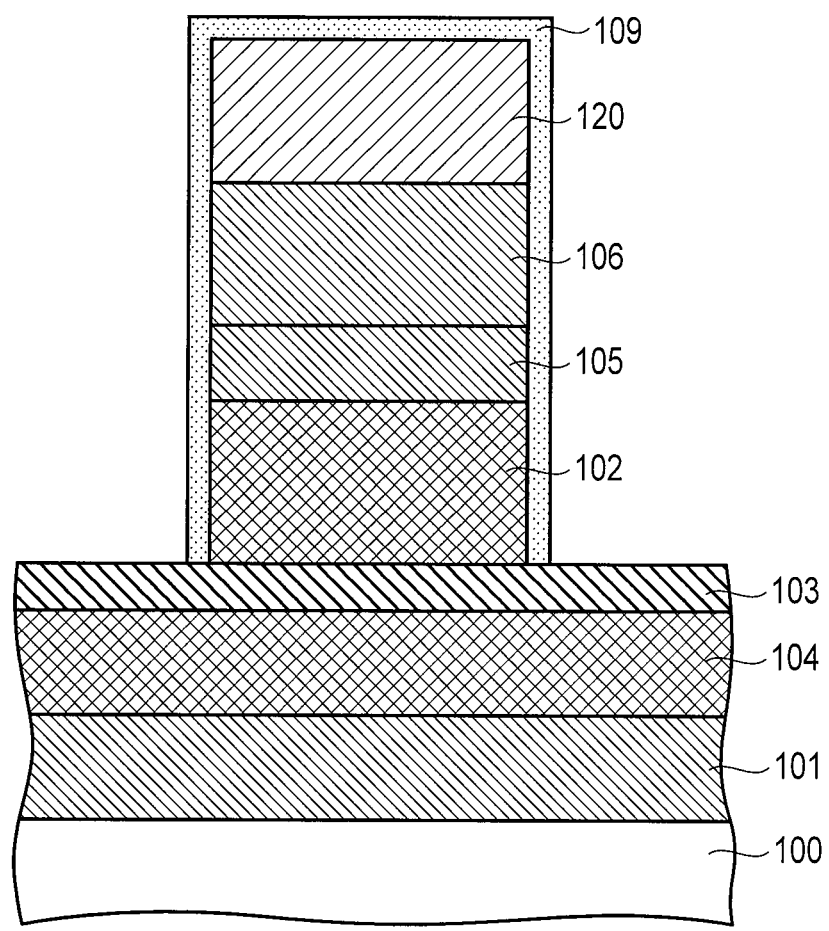
F I G. 14

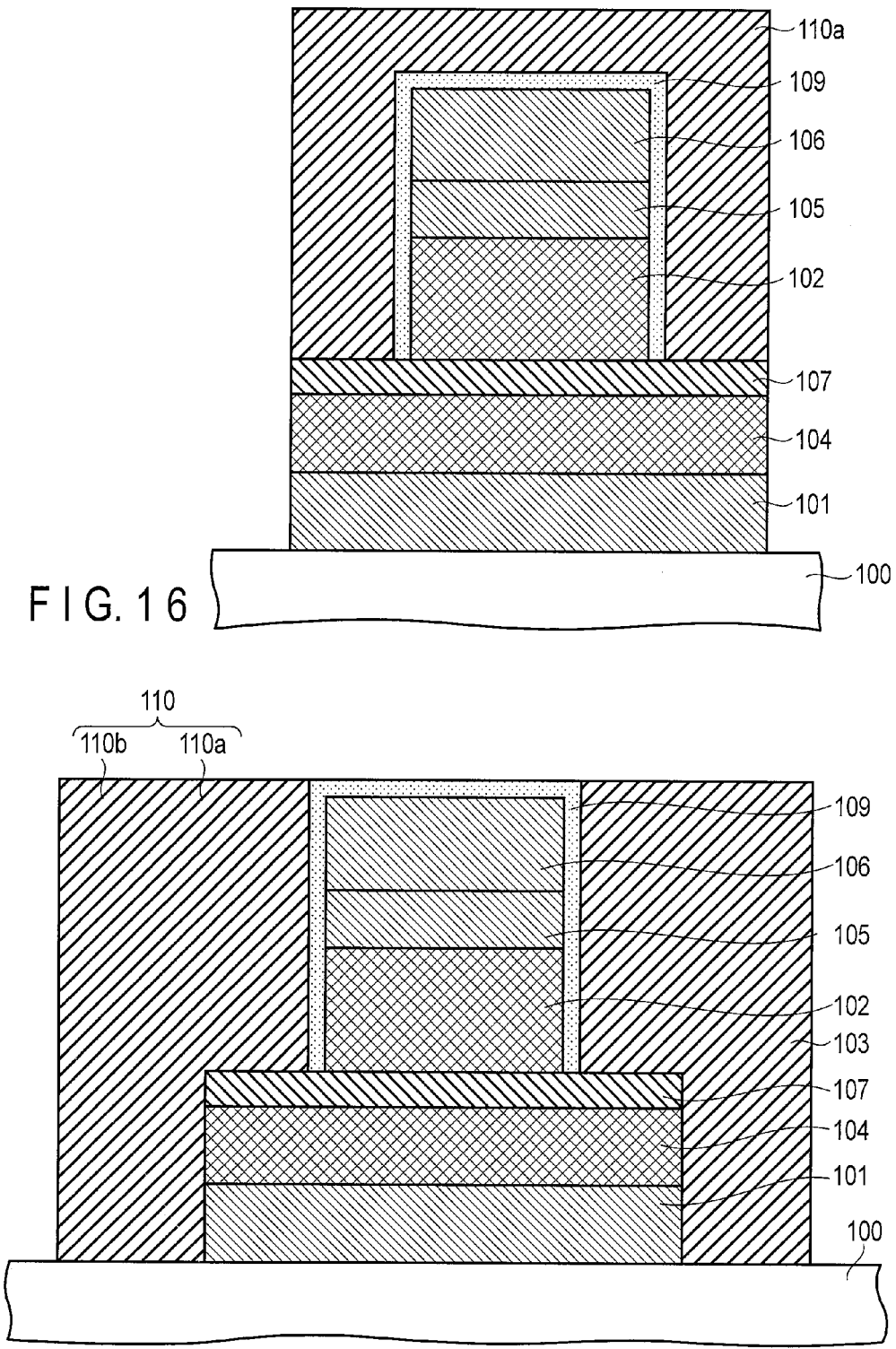
F I G. 16
F I G. 17

MAGNETORESISTIVE ELEMENT AND METHOD OF MANUFACTURING THE SAME

CROSS-REFERENCE TO RELATED APPLICATIONS

This application is a Divisional application of U.S. Ser. No. 14/202,802, filed Mar. 10, 2014, which claims the benefit of U.S. Provisional Application No. 61/875,577, filed Sep. 9, 2013, the entire contents of which are incorporated herein by reference.

FIELD

Embodiments described herein relate generally to a magnetoresistive element and a method of manufacturing the same.

BACKGROUND

In recent years, a semiconductor memory utilizing a resistance variable element as a memory element, such as a PRAM (phase-change random access memory) or an MRAM (magnetic random access memory), has been attracting attention and being developed. The MRAM is a device which performs a memory operation by storing "1" or "0" information in a memory cell by using a magnetoresistive effect, and has features of nonvolatility, high-speed operation, high integration and high reliability.

One of magnetoresistive effect elements is a magnetic tunnel junction (MTJ) element including a three-layer multilayer structure of a storage layer having a variable magnetization direction, an insulation film as a tunnel barrier, and a reference layer which maintains a predetermined magnetization direction.

The resistance of the MTJ element varies depending on the magnetization directions of the storage layer and the reference layer, it takes a minimum value when the magnetization directions are parallel, and takes a maximum value when the magnetization directions are antiparallel, and information is stored by associating the parallel state and antiparallel state with binary information "0" and binary information "1", respectively.

Writing of information into the MTJ element involves a magnetic-field write scheme in which only the magnetization direction in the storage layer is reversed by a current magnetic field that is generated when a current flowing is flowed through a write line, and a write (spin injection write) scheme using spin angular momentum movement in which the magnetization direction in the storage layer is reversed by passing a spin polarization current through the MTJ element itself.

In the former scheme, when the element size is reduced, the coercivity of a magnetic body constituting the storage layer increases and the write current tends to increase, and thus it is difficult to achieve both the miniaturization and low electric current.

On the other hand, in the latter scheme (spin injection write scheme), spin polarized electron to be injected into the MTJ element decreases with the decrease of the volume of the magnetic layer constituting the storage layer, so that it is expected that both the miniaturization and low electric current may be easily achieved.

BRIEF DESCRIPTION OF THE DRAWINGS

FIG. 3 is a sectional view for explaining the manufacturing method of the magnetic memory according to the first embodiment following FIG. 2.

FIG. 6 is a diagram showing a magnetization curve (As I/I) of an MTJ element according to an embodiment.

FIG. 7 is a diagram showing a magnetization curve (Ge I/I) of an MTJ element according to an embodiment.

FIG. 8 is a diagram showing a magnetization curve (As P/D) of an MTJ element according to an embodiment.

FIG. 9 is a diagram showing a magnetization curve (No I/I) of an MTJ element according to a comparative example.

FIG. 10 is a sectional view showing a magnetic memory according to a second embodiment.

FIG. 11 is a sectional view showing a magnetoresistive memory according to a third embodiment.

FIG. 14 is a plan view schematically showing the magnetoresistive memory according to the third embodiment following FIG. 13.

FIG. 16 is a plan view schematically showing the magnetoresistive memory according to the third embodiment following FIG. 15.

FIG. 17 is a plan view schematically showing the magnetoresistive memory according to the third embodiment following FIG. 16.

DETAILED DESCRIPTION

Figure 1:
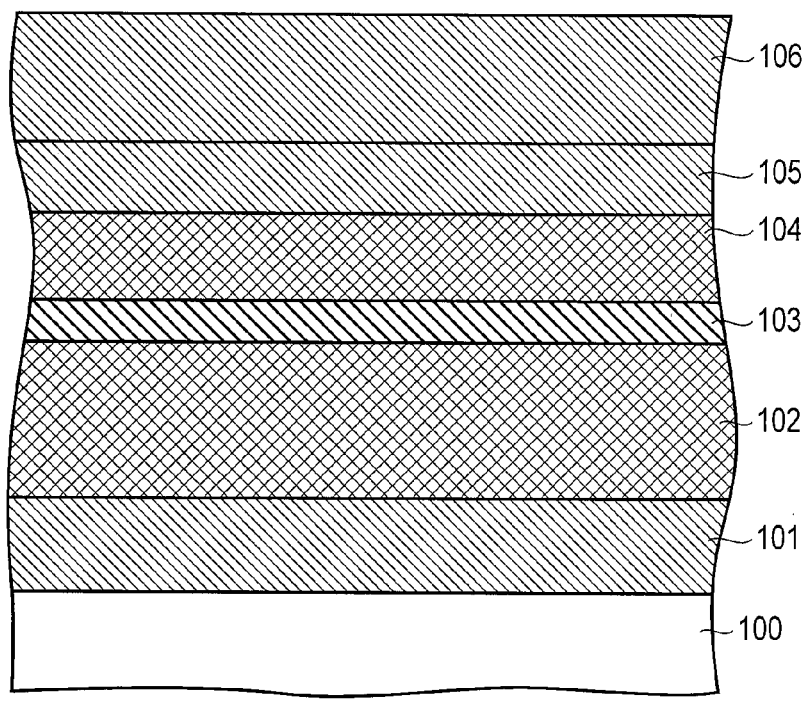
FIG. 1 is a sectional view for explaining a manufacturing method of a magnetic memory according to a first embodiment.
Figure 2:
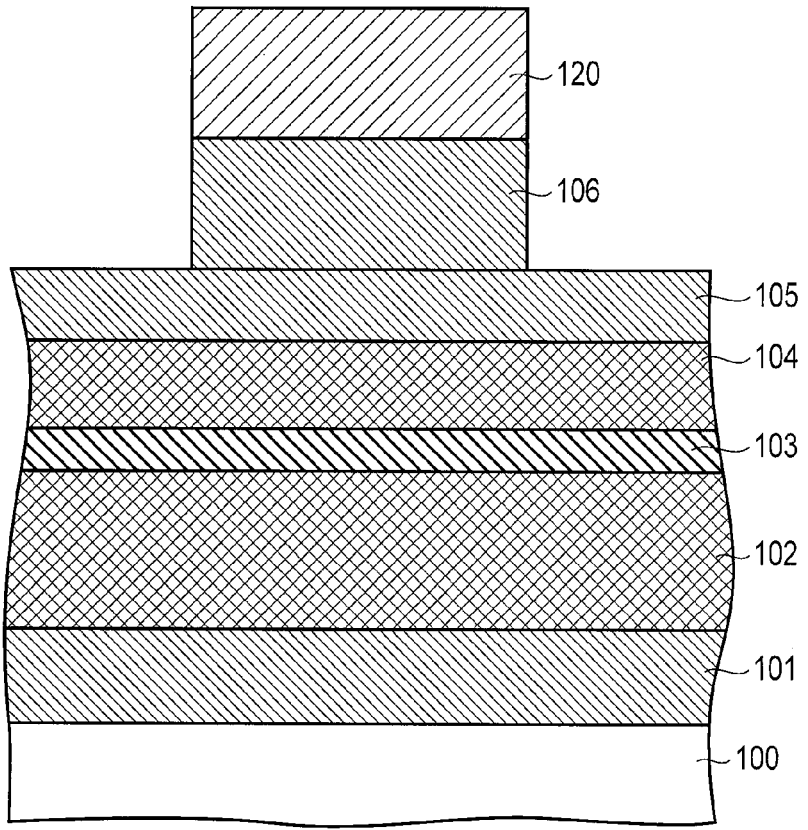
FIG. 2 is a sectional view for explaining the manufacturing method of the magnetic memory according to the first embodiment following FIG. 1.
Figure 4:
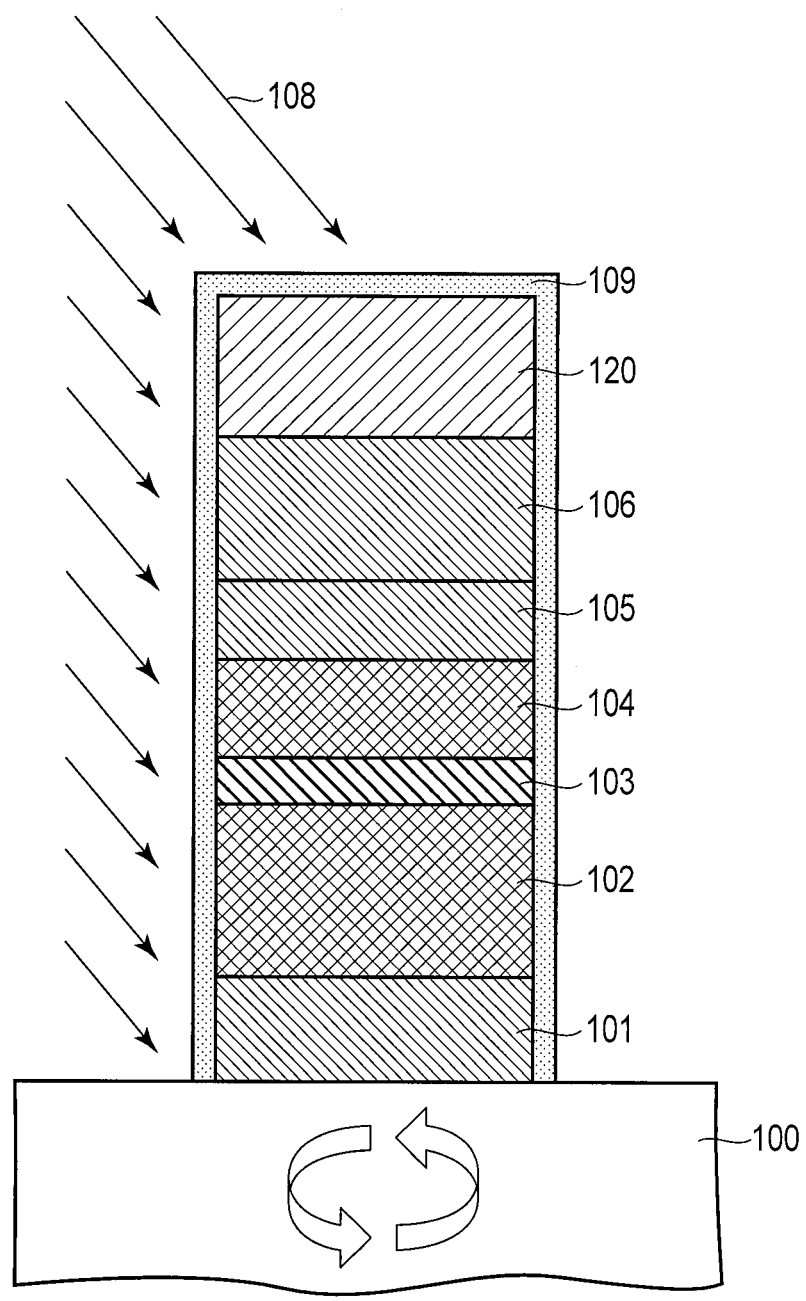
FIG. 4 is a sectional view for explaining the manufacturing method of the magnetic memory according to the first embodiment following FIG. 3.

Embodiments will be hereinafter described with reference to the accompanying drawings. In the following drawings, portions corresponding to drawings already shown will be denoted by the same signs (including a sign having a different subscript), and their detailed explanations will be omitted.

In general, according to one embodiment, a magnetoresistive element is disclosed. The magnetoresistive element includes a reference layer, a tunnel barrier layer, a storage layer. The storage layer includes a first region and a second region provided outside the first region to surround the first region, the second region including element included in the first region and another element being different from the element. The magnetoresistive element further includes a cap layer including a third region and a fourth region provided outside the third region to surround the third region, the fourth region including an element included in the third region and the another element.

According to an embodiment, a method of manufacturing a magnetoresistive element is disclosed. The method includes forming a stacked body including a reference layer, a tunnel barrier layer and a storage layer; processing the stacked body by process including RIE (reactive ion etching) process. The method further includes implanting another element being different from element included in the storage layer into a surface of the storage layer exposed by processing the stacked body.

(First Embodiment)

FIGS. 1 to 5 are sectional views for explaining a method of manufacturing a magnetic memory. In the present embodiment, a case where the magnetic memory is a magnetic random access memory (MRAM) will be described.

[FIG. 1]

A lower electrode 101, a reference layer 102, a tunnel barrier layer 103, a storage layer 104, a cap layer 105 and an upper electrode 106 are successively formed on a base 100 including a substrate not shown. A selection transistor and the like are formed on a surface of the substrate. This selection transistor is an element for selecting an MTJ element. The tunnel barrier layer 103 is, for example, magnesium oxide (MgO). The cap layer 105 comprises a material having conductivity such as Ta and Ru.

[FIG. 2]

A hard mask 120 is formed on the upper electrode 106, thereafter the upper electrode 106 is etched by RIE (reactive ion etching) process using the hard mask 120 as a mask to process the upper electrode 106 to be in a predetermined shape.

[FIG. 3]

After the upper electrode 106 is processed to be in the predetermined shape, the cap layer 105, the storage layer 104, the tunnel barrier layer 103, the reference layer 102 and the lower electrode 101 are etched by RIE process. As a result, the MTJ element in the predetermined shape is obtained.

Since the lower electrode 101, the reference layer 102, the tunnel barrier layer 103, the storage layer 104, the cap layer 105 and the upper electrode 106 are processed by RIE process, a damage layer 107 is generated on a surface of the stacked body 101 to 106 (MTJ element). One of the reasons why the damage layer 107 is generated is that the etching by RIE process brings about chemical action between etching gas and the stacked body 101 to 106.

The storage layer 104 has magnetic anisotropy. For example, the storage layer 104 has the magnetic anisotropy in a direction vertical to its film surface. The damage layer 107 generated on the surface of the storage layer 104 also has the magnetic anisotropy. However, the damage layer 107 has the magnetic anisotropy in a direction different from the storage layer 104. Since the damage layer 107 having such disordered magnetic anisotropy deteriorates the magnetic anisotropy, spin implantation efficiency and an MR ratio, the property of the MTJ element is degraded.

A plurality of MTJ elements are used for the MRAM. Generally, the same level of influence of the damage layer 107 is not caused in all the MTJ elements. Thus, variations in characteristics of the plurality of MTJ elements used for the MRAM occur. Such variations in characteristics prevent the performance of the MRAM from being improved.

[FIG. 4]

In the present embodiment, to suppress the influence of the damage layer, the damage layer is demagnetized by implanting ions 108 into the stacked body 101 to 106. By the implantation of the ions 108, the damage layer is not only magnetically deactivated, but its electric resistance may increase. Reference numeral 109 denotes a region including the damage layer into which ions are implanted (implantation region [second region]).

In the present embodiment, the ions 108 are implanted using an oblique ion implantation method. In the oblique ion implantation method, the implantation of ions are performed with the implantation angle of the ions is inclined from a direction vertical to a substrate surface. As a result, the ions 108 can be implanted in the damage layer generated on a side face of the storage layer 104. As methods of obliquely implanting the ions, (1) a method of implanting the ions a plurality of times by changing the implantation angle, (2) a method of implanting the ions by rotating a wafer, and a method obtained by combining (1) and (2) are available.

The condition of the ion implantation is, for example, as follows. The ion implantation energy is in a range of 1 to 10 keV. The dose amount is $1 \times 10^{15}$ to $5 \times 10^{16}/cm^2$.

The ion implantation may be performed in a state where the MTJ element is cooled. Thus, the ion implantation may be performed, for example, in a state where a substrate in which the MTJ element is formed is cooled. For example, the substrate is cooled by cooling a stage on which the substrate is placed. The cooling temperature of the substrate is, for example, from −100 to −50° C. Implanting the ions at a low temperature allows damage of an object into which the ions are implanted to be reduced.

An element used as the ions 108 (another element) is, for example, at least one of As, Ge, Ga, Sb, In, N, Ar, He, F, Cl, Br, I, O, Si, B, C, Zr, Tb, S, Se, P and Ti.

In the case of the present embodiment, the ions 108 are implanted not only into the damage layer generated on the storage layer 104 but into the damage layers generated on the lower electrode 101, the reference layer 102, the tunnel barrier layer 103, the cap layer 105 and the upper electrode 106. As a result, implantation regions 109 are formed also on the surfaces of the lower electrode 101, the reference layer 102, the tunnel barrier layer 103, the cap layer 105 and the upper electrode 106. A member having magnetism other than the storage layer 104 (for example, the reference layer 102) may be demagnetized, or need not be demagnetized.

Elements corresponding to the ions 108 included in a central portion of the storage layer 104 are smaller in amount than elements corresponding to the ions 108 included in the damage layer (a portion outside the central portion of the storage layer 104).

The implantation region 109 may be formed using a plasma doping method instead of the ion implantation method. Doping gas (source gas) is, for example, $AsH_3$, $PH_3$, $BF_3$ and $B_2H_6$. The implantation region 109 including at least one of As, Ge, Ga, Sb, In, N, Ar, He, F, Cl, Br, I, O, Si, B, C, Zr, Tb, S, Se, P and Ti can be formed by selecting appropriate doping gas. The plasma doping method has high productivity in comparison with the ion implantation method. The plasma doping may be performed in a state where the substrate is cooled, as well as the case of the ion implantation.

[FIG. 5]

A well-known MRAM process continues after the implantation region 109 is formed. For example, an insulating film 110 is formed on an entire surface to cover the MTJ element, a surface is planarized by CMP (chemical mechanical polishing) process, an insulating film 111 is formed on the planarized surface, a plug 112 electrically connected to the upper electrode 106 is formed in the insulating film 111, and a bit line 113 electrically connected to the plug 112 is formed.

FIGS. 6 to 8 show a magnetization curve of the MTJ element according to the embodiment. The vertical axis is magnetization and the horizontal axis is an external magnetic field. FIGS. 6 to 8 show the magnetization curves when As ion implantation, Ge ion implantation and As plasma doping are performed on the damage layer, respectively. FIG. 9 shows a magnetization curve of the MTJ element (comparative example) in which neither the ion implantation nor the plasma doping is performed on the damage layer.

It can be understood from FIGS. 6 to 9 that the damage layer are effectively demagnetized by performing the ion implantation or the plasma doping on the damage layer.

(Second Embodiment)

FIG. 10 is a sectional view showing an MRAM of the present embodiment. The present embodiment is different from the first embodiment in a positional relationship between a reference layer 102 and a storage layer 104, and in that the reference layer 102 is arranged on the storage layer 104.

The MRAM according of the present embodiment can be obtained in accordance with the manufacturing method of the first embodiment, and has an advantage similar to that of the first embodiment.

(Third Embodiment)

FIG. 11 is a sectional view showing an MRAM according to the present embodiment. Although the following is description of an MTJ structure in which a storage layer is arranged below a reference layer, the present embodiment can be applied to the MTJ structure in which the storage layer is arranged above the reference layer.

The present embodiment is different from the second embodiment in that a width of stacked body of the lower electrode 101, the storage layer 104 and the tunnel barrier layer 103 is greater than a width of stacked body of the reference layer 102, the cap layer 105 and the upper electrode 106. Such a structure can be obtained by separating a step of processing the stacked body of the lower electrode 101, the storage layer 104 and the tunnel barrier layer 103 from a step of processing the stacked body of the reference layer 102, the cap layer 105 and the upper electrode 106.

FIGS. 12 to 17 are sectional views for explaining a method for manufacturing the MRAM of the embodiment.

[FIG. 12]

The lower electrode 101, the storage layer 104, the tunnel barrier layer 103, the reference layer 102, the cap layer 105 and the upper electrode 106 are successively formed on the base 100 including the substrate not shown.

[FIG. 13]

The upper electrode 106, the cap layer 105 and the reference layer 102 are processed to be in a predetermined shape by RIE process. The process conforms to the steps of FIGS. 2 and 3 of the first embodiment. A damage layer 107 due to the RIE process is generated on surfaces of the upper electrode 106, the cap layer 105 and the reference layer 102.

[FIG. 14]

By implanting ions into the damage layer using the oblique ion implantation method, the implantation region 109 is formed and the damage layer is demagnetized. The implantation region 109 may be formed using the plasma doping method instead of the ion implantation method.

[FIG. 15]

An insulating film 110a covering the stacked body of the reference layer 102, the cap layer 105 and the upper electrode 106 is formed by depositing an insulating film and processing the insulating film using a lithography process and an etching process.

[FIG. 16]

The stacked body of the lower electrode 101, the storage layer 104 and the tunnel barrier layer 103 is etched by ion beam etching (IBE) process using the insulating film 110a as a mask. An MTJ element in the predetermined shape can be obtained in this manner.

IBE is physical etching mainly using kinetic energy of ions. Thus, the damage layer due to chemical reaction is hardly caused in the IBE process, unlike in the RIE process. In addition, since throughput in the IBE process is higher than that in the RIE process, the manufacturing method according to the present embodiment may be advantageous in productivity.

[FIG. 17]

An insulating film 110b is formed on an entire surface to cover the MTJ element, and a surface of the insulating film 110 including the insulating films 110a and 110b is planarized by CMP process.

Figure 5:
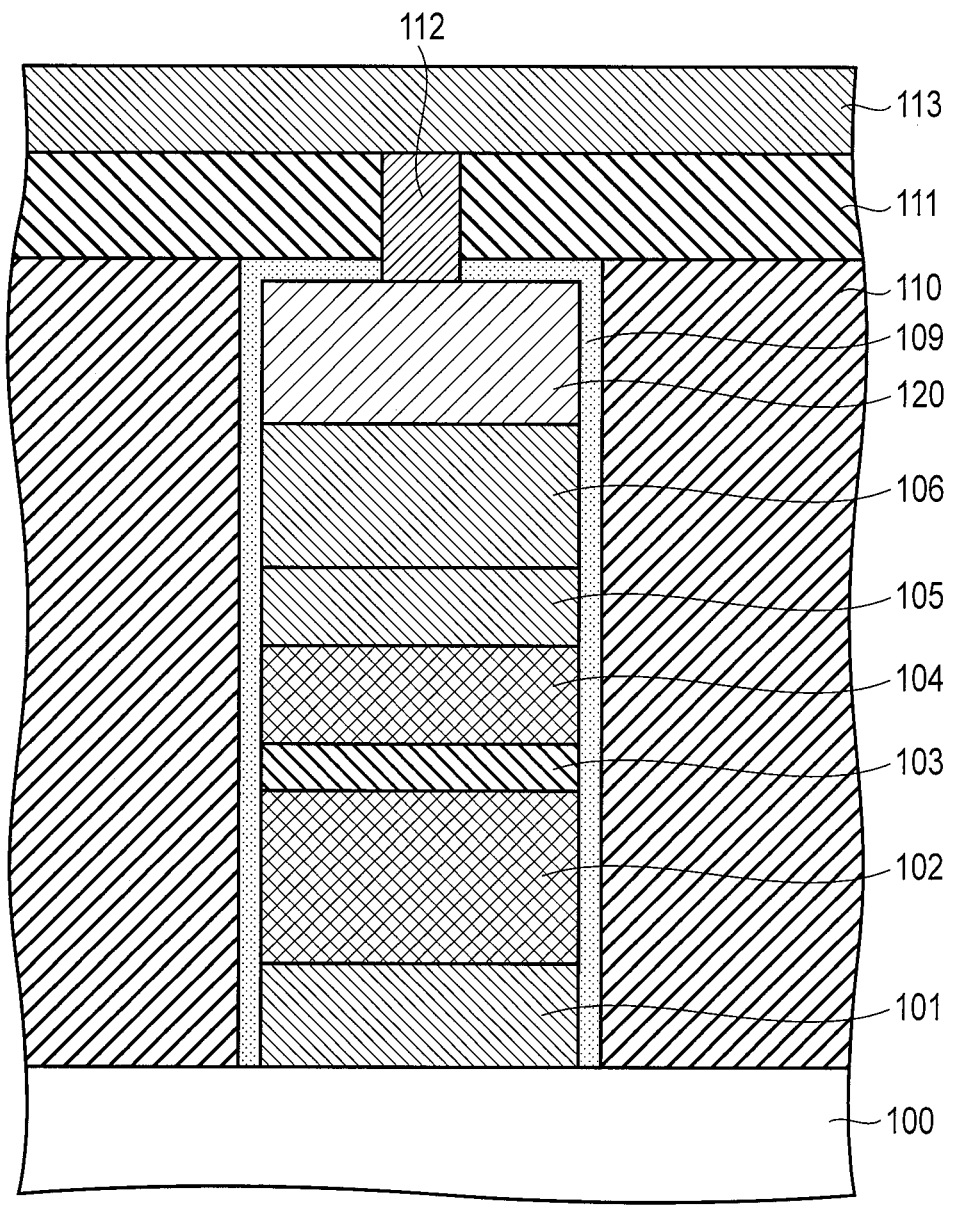
FIG. 5 is a sectional view for explaining the manufacturing method according to the first embodiment following FIG. 4.
Figure 12:
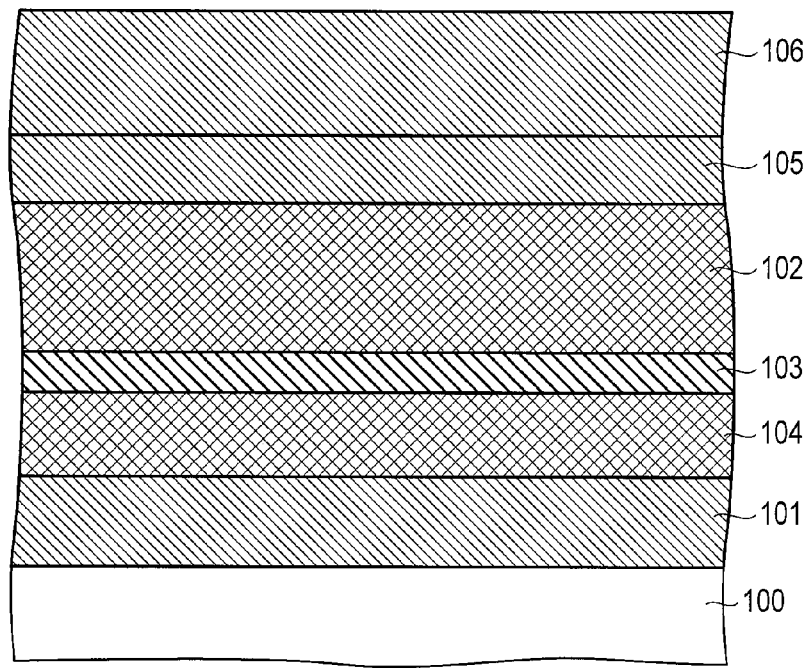
FIG. 12 is a sectional view showing a manufacturing method of the magnetoresistive memory according to the third embodiment.
Figure 13:
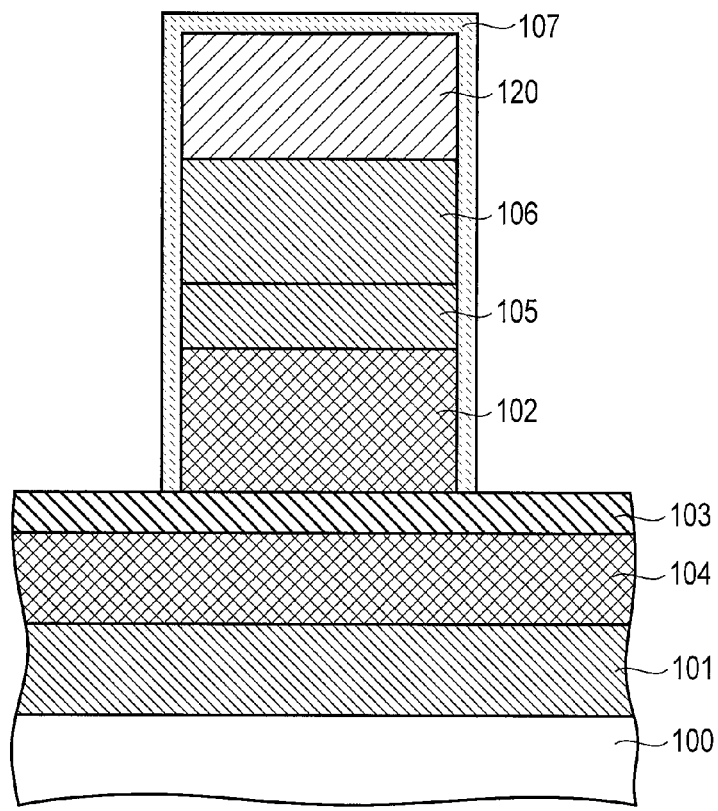
FIG. 13 is a sectional view for explaining the manufacturing method of the magnetoresistive memory according to the third embodiment following FIG. 12.
Figure 15:
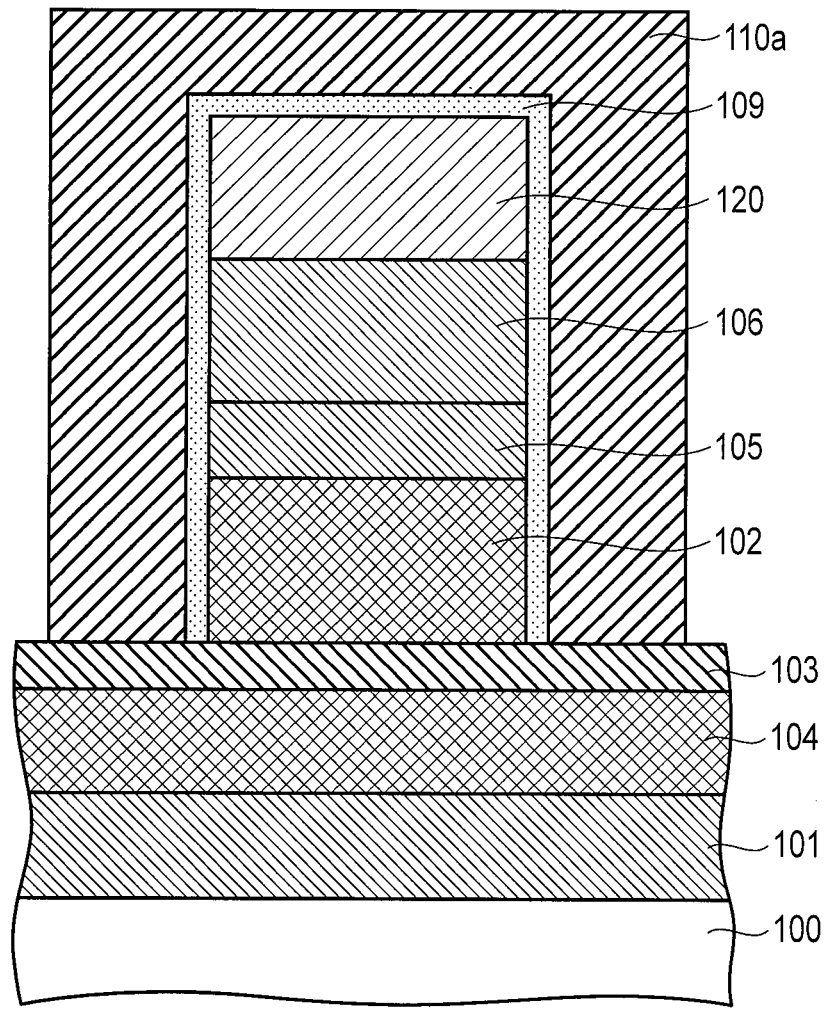
FIG. 15 is a plan view schematically showing the magnetoresistive memory according to the third embodiment following FIG. 14.

Thereafter, the insulating film 111 is formed on the planarized surface, the plug 112 electrically connected to the upper electrode 106 is formed in the insulating film 111, and the bit line 113 electrically connected to the plug 112 is formed, as in FIG. 5 of the first embodiment. The MRAM shown in FIG. 11 can be obtained in this manner.

The manufacturing method of the present embodiment can be applied to the MTJ element including a shift adjustment layer on the reference layer 102. Although MTJ elements having various types of structure are available, the manufacturing method of the present embodiment can be applied generally to a method of manufacturing an MTJ element including processing the storage layer using the RIE process.

Each of above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a magnetoresistive element comprising:
    forming a stacked body including a reference layer, a tunnel barrier layer and a storage layer;
    processing the stacked body by process including RIE (reactive ion etching) process; and
    implanting another element being different from element included in the storage layer into a surface of the storage layer exposed by processing the stacked body.

2. The method according to claim 1, wherein implanting the element is performed using ion implantation method.

3. The method according to claim 2, wherein the ion implantation method is an oblique ion implantation method.

4. The method according to claim 2, wherein implanting the another element is performed in a state where the stacked body is cooled.

5. The method according to claim 1, wherein the implanting the element is performed using a plasma doping method.

6. The method according to claim 1, wherein the another element is at least one of As, Ge, Ga, Sb, In, N, Ar, He, F, Cl, Br, I, O, Si, B, C, Zr, Tb, S, Se, P and Ti.

7. The method according to claim 1, wherein forming the stacked body including the reference layer, the tunnel barrier layer and the storage layer comprises forming the tunnel barrier layer on the reference layer, forming the storage layer on the tunnel barrier layer.

8. The method according to claim 7, wherein the forming the stacked body further comprises forming a cap layer on the storage layer.

9. The method according to claim 1, wherein forming the stacked body including the reference layer, the tunnel barrier layer and storage layer comprises forming the tunnel barrier layer on the storage layer, forming the reference layer on the tunnel barrier layer.

10. The method according to claim 9, wherein forming the stacked body further comprises forming a cap layer on the reference layer.

11. The method according to claim 10, wherein processing the stacked body comprises etching the cap layer and the reference layer which are on the tunnel barrier layer by the RIE process without etching the storage layer under the tunnel barrier layer by the RIE process.

12. The method according to claim 10, wherein the processing the stacked body further comprises etching the storage layer under the tunnel barrier layer by IBE (ion beam etching) process.

* * * * *